US009722011B2

United States Patent
Lin et al.

(10) Patent No.: US 9,722,011 B2
(45) Date of Patent: Aug. 1, 2017

(54) FILM SCHEME FOR MIM DEVICE

(71) Applicant: Taiwan Semiconductor Manufacturing Co., Ltd., Hsin-Chu (TW)

(72) Inventors: Hsing-Lien Lin, Hsin-Chu (TW);
Yao-Wen Chang, Taipei (TW);
Cheng-Yuan Tsai, Chu-Pei (TW);
Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 152 days.

(21) Appl. No.: 14/261,518

(22) Filed: Apr. 25, 2014

(65) Prior Publication Data
US 2015/0311273 A1 Oct. 29, 2015

(51) Int. Cl.
*H01L 21/00* (2006.01)
*H01L 49/02* (2006.01)

(52) U.S. Cl.
CPC .................. *H01L 28/40* (2013.01)

(58) Field of Classification Search
CPC ..... H01L 29/7869; H01L 28/40; H01L 28/55; H01L 29/517; H01L 21/02186; H01L 21/02189
See application file for complete search history.

(56) References Cited

U.S. PATENT DOCUMENTS

| 6,611,014 | B1* | 8/2003 | Kanaya | H01L 27/11502 257/295 |
| 2002/0127792 | A1* | 9/2002 | Yoshitomi | H01L 21/76834 438/239 |
| 2007/0262417 | A1* | 11/2007 | Ohtake | H01L 23/5223 257/532 |
| 2010/0172065 | A1* | 7/2010 | Huang | H01G 4/10 361/313 |
| 2012/0153434 | A1* | 6/2012 | Abou-Khalil | H01L 23/5223 257/532 |
| 2013/0143379 | A1* | 6/2013 | Malholtra | H01L 28/40 438/381 |
| 2015/0179730 | A1* | 6/2015 | Hashim | H01L 27/10805 257/532 |

* cited by examiner

*Primary Examiner* — Julia Slutsker
(74) *Attorney, Agent, or Firm* — Eschweiler & Potashnik, LLC

(57) ABSTRACT

The present disclosure relates to a MIM (metal-insulator-metal) capacitor having a multi-layer capacitor dielectric layer including an amorphous dielectric layer configured to mitigate the formation of leakage paths, and a method of formation. In some embodiments, the MIM (metal-insulator-metal) capacitor has a capacitor bottom metal layer. A multi-layer capacitor dielectric layer is disposed over the capacitor bottom metal layer. The multi-layer capacitor dielectric layer has an amorphous dielectric layer abutting a high-k dielectric layer. A capacitor top metal layer is disposed over the multi-layer capacitor dielectric layer. The high-k dielectric layer within the capacitor dielectric layer provides the MIM capacitor with a high capacitance density, while the amorphous dielectric layer prevents leakage by blocking the propagation of grain boundaries between the capacitor top metal layer and the capacitor bottom metal layer.

20 Claims, 7 Drawing Sheets

FILM SCHEME FOR MIM DEVICE

BACKGROUND

Modern day integrated chips comprise millions or billions of transistor devices, which are configured to enable logical functionality for an integrated chip (e.g., form a processor configured to perform logic functions). Often integrated chips may also comprise passive devices, such as capacitors, resistors, inductors, varactors, etc. Metal-insulator-metal (MIM) capacitors are a common type of passive device that is often integrated into the back-end-of-the-line metal interconnect layers of integrated chips. For example, MIM capacitors may be used as decoupling capacitors configured to mitigate power supply or switching noise (e.g., switching of input/output (I/O) and core circuits) caused by changes in current flowing through various parasitic inductances associated with an integrated chip and a package in which the integrated chip is located.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
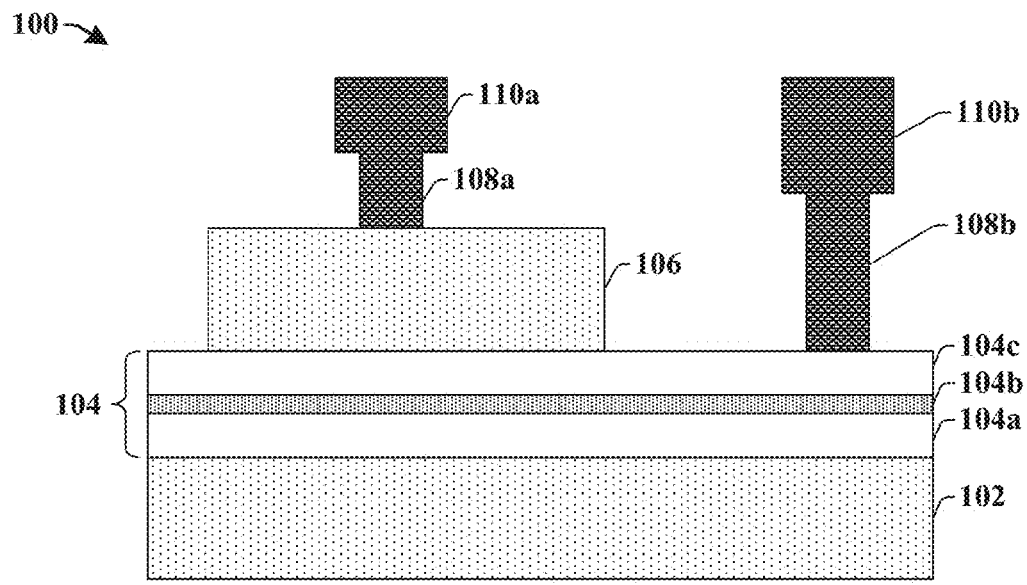
FIG. 1 illustrates a cross-sectional view of some embodiments of a metal-insulator-metal (MIM) capacitor having a multi-layer capacitor dielectric layer comprising an amorphous dielectric layer abutting a crystalline high-k dielectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors are often implemented into the back-end-of-the-line (BEOL) metal interconnect layers of integrated chips. MIM capacitors typically have a top metal plate and a bottom metal plate separated by a capacitor dielectric layer. As the minimum feature sizes of integrated chips continue to decrease, MIM capacitors have begun to use capacitor dielectric layers comprising high-k dielectric materials. High-k dielectric materials having a relatively high dielectric constant allow for a MIM capacitor to store energy within a smaller chip area (e.g., since the capacitance of a MIM capacitor is proportional to the dielectric constant of a capacitor dielectric layer multiplied by the areas of a capacitor electrode).

However, such high-k dielectric materials typically have relatively low energy band-gaps. It has been appreciated that the low energy band-gaps can lead to increased time dependent dielectric breakdown (TDDB) of a high-k dielectric material. For example, thermal stress on a capacitor dielectric layer can induce the formation of grain boundaries within the capacitor dielectric layer. The grain boundaries provide for leakage paths between a capacitor bottom metal layer and a capacitor top metal layer, which can lead to reliability issues and device failure.

Accordingly, the present disclosure relates to a MIM (metal-insulator-metal) capacitor having a multi-layer capacitor dielectric layer comprising an amorphous dielectric layer configured to mitigate the formation of leakage paths, and a method of formation. In some embodiments, the MIM (metal-insulator-metal) capacitor comprises a capacitor bottom metal layer. A multi-layer capacitor dielectric layer is disposed over the capacitor bottom metal layer. The multi-layer capacitor dielectric layer comprises an amorphous dielectric layer abutting a high-k dielectric layer. A capacitor top metal layer is disposed over the multi-layer capacitor dielectric layer. The high-k dielectric layer within the capacitor dielectric layer provides the MIM capacitor with a high capacitance density, while the amorphous dielectric layer prevents leakage by blocking the propagation of grain boundaries between the capacitor top metal layer and the capacitor bottom metal layer.

FIG. 1 illustrates a cross-sectional view of some embodiments of a metal-insulator-metal (MIM) capacitor 100 having a multi-layer capacitor dielectric layer 104 comprising an amorphous dielectric layer 104b abutting a high-k dielectric layer, 104a or 104c.

The MIM capacitor 100 comprises a capacitor bottom metal (CBM) layer 102 and a capacitor top metal (CTM)

layer 106. The capacitor bottom metal layer 102 is separated from a capacitor top metal layer 106 by a multi-layer capacitor dielectric layer 104. By separating the capacitor bottom metal layer 102 from the capacitor top metal layer 106 with the multi-layer capacitor dielectric layer 104, charges can accumulate on the capacitor bottom metal layer 102 and the capacitor top metal layer 106. The charges generate an electric field between the capacitor bottom metal layer 102 and the capacitor top metal layer 106, in which the MIM capacitor 100 can store energy.

The multi-layer capacitor dielectric layer 104 comprises a high-k dielectric layer, 104a or 104c, abutting an amorphous dielectric layer 104b. In some embodiments, the amorphous dielectric layer 104b is disposed between a first high-k dielectric layer 104a and a second high-k dielectric layer 104c. The high-k dielectric layer, 104a or 104c, comprises a high-k dielectric material (e.g., a dielectric material having a dielectric constant greater than silicon dioxide) that is configured to provide the multi-layer capacitor dielectric layer 104 with a relatively high dielectric constant that improves energy storage of the MIM capacitor 100. For example, in some embodiments, the high-k dielectric layer, 104a or 104c, comprises a high-k dielectric material having a dielectric constant that is greater than approximately 4. The amorphous dielectric layer 104b comprises a relatively large energy band gap that is configured to improve dielectric breakdown (e.g., TDDB) of the multi-layer capacitor dielectric layer 104. The resulting multi-layer capacitor dielectric layer 104 exhibits a good capacitance density and reliability.

MIM capacitor 100 further comprises a first metal via 108a and a second metal via 108b configured to provide electrical connections to the capacitor top metal layer 106 and the capacitor bottom metal layer 102, respectively. The first metal via 108a vertically extends from a first metal wire 110a to a top surface of the capacitor top metal layer 106. The second metal via 108b vertically extends from a second metal wire 110b to the top surface of the capacitor bottom metal layer 102.

Figure 2:
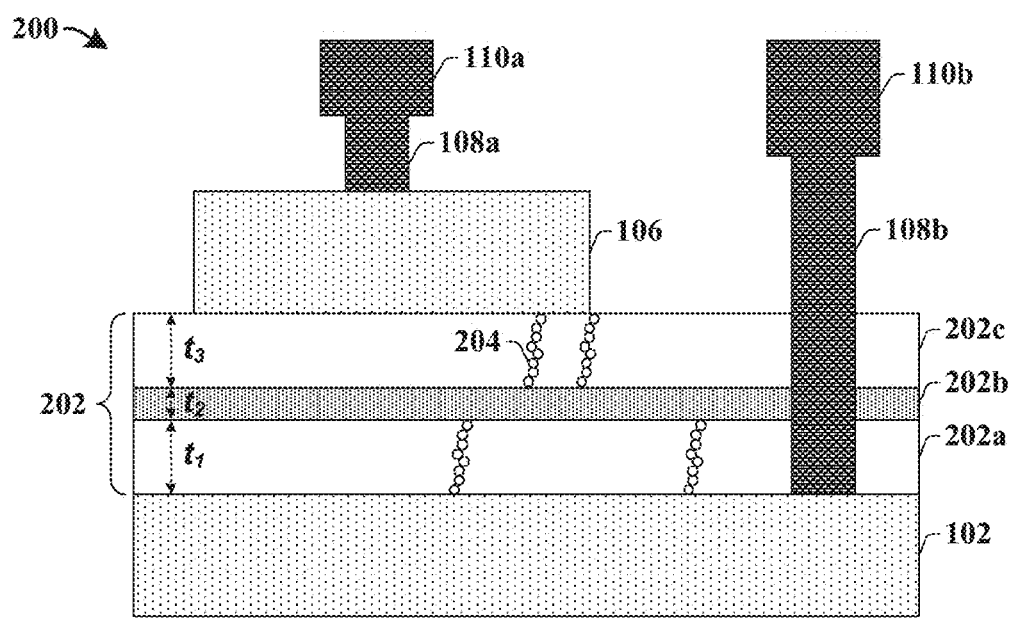
FIG. 2 illustrates a cross-sectional view of some additional embodiments of MIM capacitor having a multi-layer capacitor dielectric layer comprising an amorphous dielectric layer disposed between crystalline high-k dielectric layers.

FIG. 2 illustrates a cross-sectional view of some additional embodiments of MIM capacitor 200 having a multi-layer capacitor dielectric layer 202 comprising an amorphous dielectric layer 202b disposed between crystalline high-k dielectric layers, 202a and 202c.

The MIM capacitor 200 comprises a capacitor bottom metal layer 102 separated from a capacitor top metal layer 106 by a multi-layer capacitor dielectric layer 202. The multi-layer capacitor dielectric layer 202 comprises a first crystalline high-k dielectric layer 202a disposed over the capacitor bottom metal layer 102. The multi-layer capacitor dielectric layer 202 further comprises an amorphous dielectric layer 202b disposed onto the first crystalline high-k dielectric layer 202a, and a second crystalline high-k dielectric layer 202c disposed onto the amorphous dielectric layer 202b. The first and second crystalline high-k dielectric layers, 202a and 202c, comprise a material having a crystalline structure (e.g., a lattice with a long-term periodic crystalline structure), while the amorphous dielectric layer 202b comprises a material having a non-crystalline structure (e.g., a lattice without a long-term periodic crystalline structure).

The first and second crystalline high-k dielectric layers, 202a and 202c, have a larger dielectric constant than the amorphous dielectric layer 202b. For example, in some embodiments, the first and second crystalline high-k dielectric layers, 202a and 202c, may have a dielectric constant that is greater than 10, while the amorphous dielectric layer 202b may have a dielectric constant that is less than 4. The larger dielectric constant of the first and second crystalline high-k dielectric layers, 202a and 202c, provides the multi-layer capacitor dielectric layer 202 with a relatively high dielectric constant that allows for MIM capacitor 200 to have a high capacitance density (e.g., greater than 10 fF/$\mu m^2$).

The amorphous dielectric layer 202b has a larger band gap than the first and second crystalline high-k dielectric layers, 202a and 202c. For example, in some embodiments, the amorphous dielectric layer 202b may have a band gap of greater than 8 eV, while the high-k dielectric layer may have a band gap of less than 4.5 eV. The larger band gap of the amorphous dielectric layer 202b prevents the formation of grain boundaries 204 within the amorphous dielectric layer 202b, thereby preventing the propagation of grain boundaries 204 between the capacitor bottom metal layer 102 and the capacitor top metal layer 106 (i.e., preventing the propagation of grain boundaries 204 through the multi-layer capacitor dielectric layer 202). For example, grain boundaries 204 may form in the first crystalline high-k dielectric layer 202a and the second crystalline high-k dielectric layer 202c due to thermal stress on the MIM capacitor 200. However, due to the relatively large band gap of the amorphous dielectric layer 202b, the grain boundaries 204 will not propagate into the amorphous dielectric layer 202b. By preventing the formation of grain boundaries between the capacitor bottom metal layer 102 and the capacitor top metal layer 106, leakage within the MIM capacitor 200 is reduced.

In some embodiments, the first crystalline high-k dielectric layer 202a may have a first thickness $t_1$, the amorphous dielectric layer 202b may have a second thickness $t_2$, and the second crystalline high-k dielectric layer 202c may have a third thickness $t_3$. In some embodiments, the first thickness $t_1$ and the third thickness $t_3$ may be in a range of between approximately 15 angstroms and approximately 80 angstroms. In some embodiments, the second thickness $t_2$ may be in a range of between approximately 5 angstroms and approximately 50 angstroms. In some embodiments, the first thickness $t_1$ and the third thicknesses $t_3$ may be substantially the same. Using a substantially same first and third thicknesses, $t_1$ and $t_3$, provides for the MIM capacitor 200 with symmetric I-V characteristics In various embodiments, a ratio of the first thickness $t_1$, the second thickness $t_2$, and the third thickness $t_3$ (i.e., $t_1:t_2:t_3$) may be selected to be different to give MIM capacitor 200 different capacitances and/or resistances to time dependent dielectric breakdown (TDDB). For example, by increasing a thickness of the amorphous dielectric layer 202b relative to thicknesses of the first and second crystalline high-k dielectric layers, 202a and 202c, the TDDB of the MIM capacitor 200 will be improved. Alternatively, by increasing a thickness of the first and second crystalline high-k dielectric layers, 202a and 202c, relative to thicknesses of the amorphous dielectric layer 202b, the capacitance of the MIM capacitor 200 will be improved. In some embodiments a ratio of the first thickness $t_1$ to the second thickness $t_2$ to the third thickness $t_3$ (i.e., $t_1:t_2:t_3$) may be in a range of between approximately 0.3:1:0.3 and approximately 15:1:15. In other words, the first crystalline high-k dielectric layer 202a and the second crystalline high-k dielectric layer 202c respectively have thicknesses, $t_1$ and $t_3$, which are in a range of between 30% and 1,500% of a thickness $t_2$ of the amorphous dielectric layer 202b.

Figure 3:
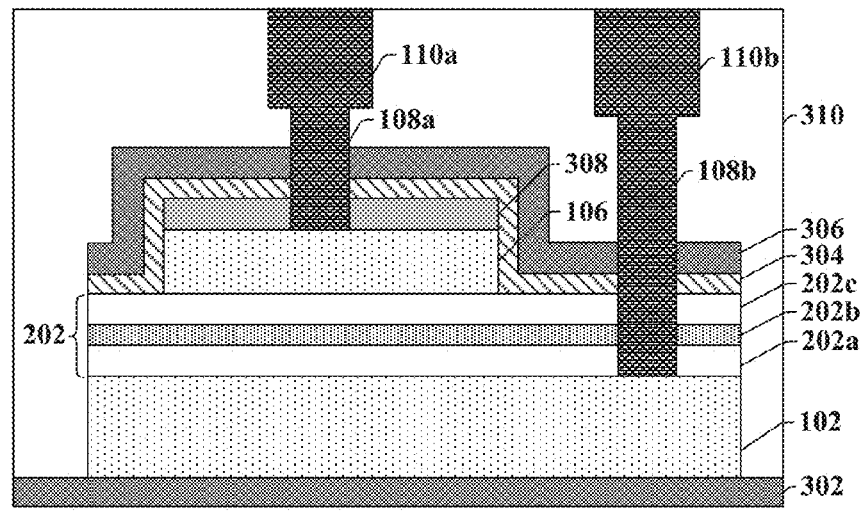
FIG. 3 illustrates a cross-sectional view of some embodiments of a metal-insulator-metal (MIM) capacitor having a multi-layer capacitor dielectric layer.

FIG. 3 illustrates a cross-sectional view of some additional embodiments of a metal-insulator-metal (MIM) capacitor 300 having a multi-layer capacitor dielectric layer 202.

The MIM capacitor 300 comprises a capacitor bottom metal layer 102 disposed over a first etch stop layer 302. The first etch stop layer 302 may disposed onto a lower metal interconnect layer (not shown) surrounded by a lower inter-level dielectric (ILD) layer within a BEOL metallization stack. In some embodiments, the lower metal interconnect layer may comprise one of a plurality of metal interconnect layers disposed between the first etch stop layer 302 and an underlying semiconductor substrate (not shown).

A multi-layer capacitor dielectric layer 202 is disposed over a top surface of the capacitor bottom metal layer 102. The multi-layer capacitor dielectric layer 202 comprises a first crystalline high-k dielectric layer 202a located over the capacitor bottom metal layer 102, an amorphous dielectric layer 202b disposed onto the first crystalline high-k dielectric layer 202a, and a second crystalline high-k dielectric layer 202c disposed onto the amorphous dielectric layer 202b. In some embodiments, the first crystalline high-k dielectric layer 202a and the second crystalline high-k dielectric layer 202c may comprise zirconium oxide ($ZrO_2$), hafnium oxide ($HfO_2$), yttrium oxide ($Y_2O_3$), or titanium oxide ($TiO_2$). In some embodiments, the amorphous dielectric layer 202b may comprise aluminum oxide ($AlO_2$) or silicon oxide ($SiO_2$).

A capacitor top metal layer 106 is disposed over a top surface of the multi-layer capacitor dielectric layer 202. In some embodiments, the capacitor bottom metal layer 102 and the capacitor top metal layer 106 may comprise one or more of aluminum (Al), titanium (Ti), titanium nitride (TiN), tantalum (Ta), tantalum nitride (TaN), tungsten (W), tungsten nitride (WN), copper (Cu), platinum (Pt), palladium (Pd), etc.

In some embodiments, a masking layer 308 is disposed over the capacitor top metal layer 106. In some embodiments, the masking layer 308 may comprise silicon nitride (SiN), protective silicon oxy-nitride (PE-SiON), or silicon carbide (SiC). A capping layer 304 (e.g., a dielectric) may be disposed onto the masking layer 308 and the multi-layer capacitor dielectric layer 202. In some embodiments, the capping layer 304 may comprise an oxide layer, for example. In some embodiments, a second etch stop layer 306 may be disposed over the capping layer 304. In some embodiments, the second etch stop layer 306 may comprise silicon nitride (SiN), silicon oxy-nitride (SiON), or silicon carbide (SiC), for example. In some embodiments, the MIM capacitor 300 further comprises an inter-level dielectric (ILD) layer 310 (e.g., an oxide, a low-k dielectric, an ultra low-k dielectric, etc.) disposed over the second etch stop layer 306.

Figure 4:
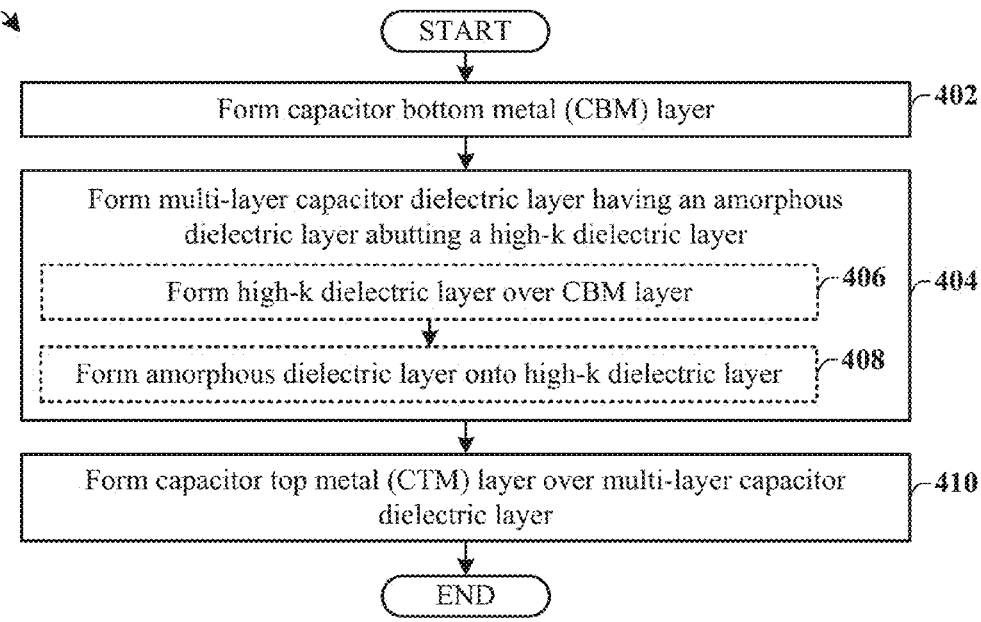
FIG. 4 illustrates a flow diagram of some embodiments of a method of forming a MIM capacitor having a multi-layer capacitor dielectric layer comprising an amorphous dielectric layer abutting a crystalline high-k dielectric layer.

FIG. 4 illustrates a flow diagram of some embodiments of a method 400 of forming a MIM capacitor having a multi-layer capacitor dielectric layer comprising an amorphous dielectric layer abutting a crystalline high-k dielectric layer.

At 402, a capacitor bottom metal (CBM) layer is formed.

At 404, a multi-layer capacitor dielectric layer is formed over the capacitor bottom metal layer. The multi-layer capacitor dielectric layer comprises an amorphous dielectric layer abutting a high-k dielectric layer. In some embodiments, the multi-layer capacitor dielectric layer may be formed by forming a high-k dielectric layer over the capacitor bottom metal layer, and by subsequently forming an amorphous dielectric layer onto the high-k dielectric layer. In some embodiments, the multi-layer capacitor dielectric layer comprises may one or more additional amorphous dielectric layers and/or high-k dielectric layers.

The high-k dielectric layer has a larger dielectric constant than the amorphous dielectric layer, while the amorphous dielectric layer has a larger band-gap than the high-k dielectric layer. The larger dielectric constant of the high-k dielectric layer provides the multi-layer capacitor dielectric layer with a relatively high dielectric constant that allows for a MIM capacitor to have a high capacitance density. The larger band gap of the amorphous dielectric layer prevents formation of grain boundaries within the amorphous dielectric layer, thereby mitigating leakage by preventing the propagation of grain boundaries through the multi-layer capacitor dielectric layer.

At 410, a capacitor top metal (CTM) layer is formed over the multi-layer capacitor dielectric layer.

Figure 5:
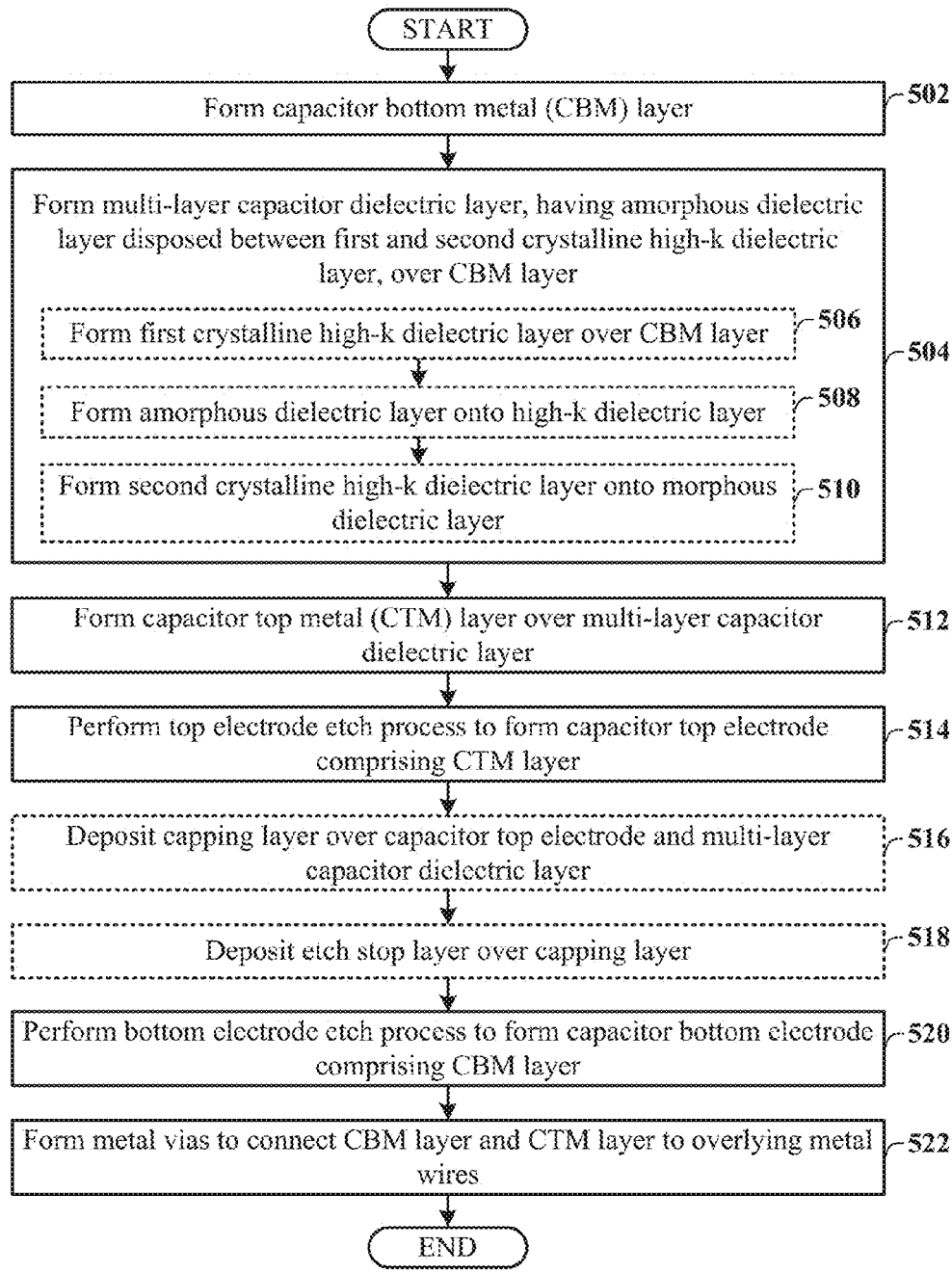
FIG. 5 illustrates a flow diagram of some additional embodiments of a method of forming a MIM capacitor having a multi-layer capacitor dielectric layer comprising an amorphous dielectric layer disposed between first and second crystalline high-k dielectric layers.

FIG. 5 illustrates a flow diagram of some additional embodiments of a method 500 of forming a MIM capacitor having a multi-layer capacitor dielectric layer comprising an amorphous dielectric layer disposed between first and second crystalline high-k dielectric layers.

While the disclosed methods (e.g., methods 400 and 500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a capacitor bottom metal layer is formed.

At 504, a multi-layer capacitor dielectric layer is formed over the capacitor bottom metal layer. In some embodiments, the multi-layer capacitor dielectric layer is formed by depositing a first crystalline high-k dielectric layer over the capacitor bottom metal layer, at 506. An amorphous dielectric layer is then deposited onto the first crystalline high-k dielectric layer, at 508. A second crystalline high-k dielectric layer is then deposited onto the amorphous dielectric layer, at 510.

At 512, a capacitor top metal layer is formed onto the second crystalline high-k dielectric layer of the multi-layer capacitor dielectric layer.

At 514, a top electrode etch process is performed to pattern the capacitor top metal layer to form a capacitor top electrode.

At 516, a capping layer may be formed over the capacitor top electrode and the multi-layer capacitor dielectric layer, in some embodiments.

At 518, an etch stop layer may be formed over the capping layer, in some embodiments.

At 520, a bottom electrode etch process is performed to pattern the capacitor bottom metal layer to form a capacitor bottom electrode. The bottom electrode etch process may also pattern the multi-layer capacitor dielectric layer, the capping layer, and/or the etch stop layer.

At 522, metal vias are formed to connect the capacitor bottom metal layer (i.e., the capacitor bottom electrode) and the capacitor top metal layer (i.e., the capacitor top electrode) to overlying metal wires.

FIGS. 6-12 illustrate some embodiments of cross-sectional views showing a method of forming a MIM capacitor having a multi-layer capacitor dielectric layer comprising an amorphous dielectric layer disposed between crystalline high-k dielectric layers. Although FIGS. 6-12 are described in relation to method 500, it will be appreciated that the structures disclosed in FIGS. 6-12 are not limited to such a method, but instead may stand alone as structures independent of the method.

Figure 6:
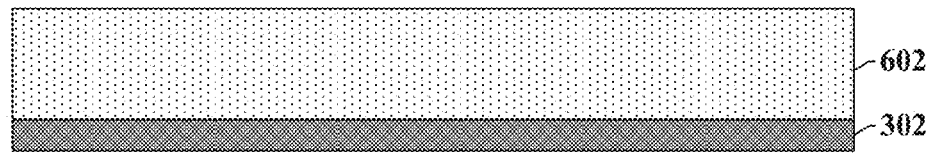
FIGS. 6-12 illustrate some embodiments of cross-sectional views showing a method of forming a MIM capacitor having a multi-layer capacitor dielectric layer comprising an amorphous dielectric layer disposed between crystalline high-k dielectric layers.

FIG. 6 illustrates some embodiments of a cross-sectional view 600 corresponding to act 502.

As shown in cross-sectional view 600, a capacitor bottom metal layer 602 is formed. The capacitor bottom metal layer 602 may be deposited by way of a physical vapor deposition (PVD) process. In some embodiments, the capacitor bottom metal layer 602 may comprise titanium nitride (TiN) or tantalum nitride (TaN). In some embodiments, the capacitor bottom metal layer 602 may be deposited over a first etch stop layer 302 disposed over an underlying inter-level dielectric (ILD) layer (not shown). In some embodiments, the first etch stop layer 302 may comprise silicon carbide (SiC), for example.

Figure 7A:
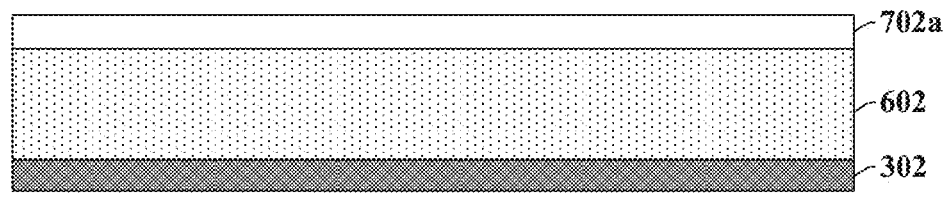
Figure 7B:
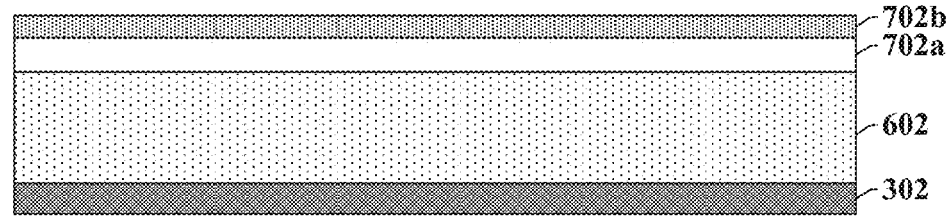
Figure 7C:
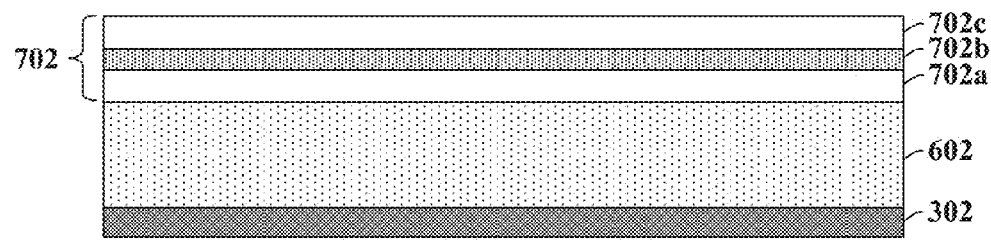

FIGS. 7A-7C illustrate some embodiments of a cross-sectional views, 700, 704 and 706, corresponding to the formation of a multi-layer capacitor dielectric layer, as recited in act 504.

FIG. 7A illustrates some embodiments of a cross-sectional view 700 corresponding to act 506.

As shown in cross-sectional view 700, a first crystalline high-k dielectric layer 702a is formed over the capacitor bottom metal layer 602. In some embodiment, the first crystalline high-k dielectric layer 702a may comprise zirconium oxide ($ZrO_2$), hafnium oxide ($HfO_2$), yttrium oxide ($Y_2O_3$), or titanium oxide ($TiO_2$) formed by an atomic layer deposition (ALD) process to a thickness in a range of between approximately 15 angstroms and approximately 80 angstroms.

In some embodiments, the first crystalline high-k dielectric layer 702a may be formed using a prolonged exposure to an oxidizing agent to increase a dielectric constant of the first crystalline high-k dielectric layer 702a. In some embodiments, the first crystalline high-k dielectric layer 702a may be formed using an ALD process that deposits a plurality of atomic layers, wherein each atomic layer is deposited using a pronged exposure to an ozone gas ($O_3$). For example, in an n-cycle ALD process, a first cycle may be performed by introducing a TEMAZr precursor gas and ozone ($O_3$) into a processing chamber to form a first zirconium oxide atomic layer that is exposed to $O_3$ during the first cycle (e.g., for approximately 5 minutes) and during n−1 subsequent cycles. Additional cycles may be subsequently performed to form additional zirconium oxide atomic layers that are exposed to $O_3$ for prolonged times (e.g., a second atomic layer is exposed to $O_3$ during a second cycle for 5 minutes and during n−2 subsequent cycles of 5 minutes, etc.). In other embodiments, the first crystalline high-k dielectric layer 702a may be formed using an ALD process that deposits a plurality of atomic layers, wherein a top atomic layer is deposited using a pronged exposure to an ozone gas ($O_3$). It has been appreciated that such prolonged exposures to an oxidizing agent may increase grain boundaries within the first crystalline high-k dielectric layer 702a, however the use of an overlying amorphous dielectric layer 702b prevents the propagation of grain boundaries formed by the prolonged exposure.

FIG. 7B illustrates some embodiments of a cross-sectional view 704 corresponding to act 508.

As shown in cross-sectional view 704, an amorphous dielectric layer 702b is formed onto the first crystalline high-k dielectric layer 702a. In some embodiment, the amorphous dielectric layer 702b may comprise aluminum oxide ($AlO_2$) or silicon oxide ($SiO_2$) formed by an ALD process to a thickness in a range of between approximately 5 angstroms and approximately 50 angstroms. In some embodiments, the amorphous dielectric layer 702b may be formed using a prolonged exposure to an oxidizing agent to increase a dielectric constant of the amorphous dielectric layer 702b.

FIG. 7C illustrates some embodiments of a cross-sectional view 706 corresponding to act 510.

As shown in cross-sectional view 706, a second crystalline high-k dielectric layer 702c is formed onto the amorphous dielectric layer 702b. In some embodiment, the second crystalline high-k dielectric layer 702c may comprise $ZrO_2$, $HfO_2$, $Y_2O_3$, or $TiO_2$ formed by an ALD process to a thickness in a range of between approximately 15 angstroms and approximately 80 angstroms. In some embodiments, the second crystalline high-k dielectric layer 702c may be formed using a prolonged exposure to an oxidizing agent to increase a dielectric constant of the second crystalline high-k dielectric layer 702c.

Figure 8:
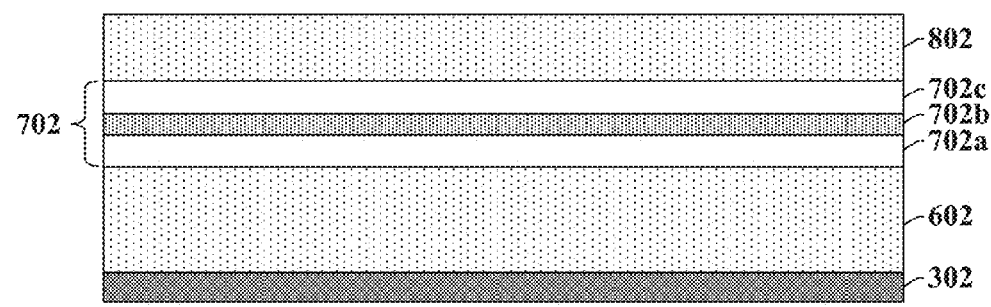

FIG. 8 illustrates some embodiments of a cross-sectional view 800 corresponding to act 512.

As shown in cross-sectional view 800, a capacitor top metal layer 802 is formed over the multi-layer capacitor dielectric layer 702. In some embodiments, the capacitor top metal layer 802 may comprise titanium nitride (TiN) or tantalum nitride (TaN), for example. In some embodiments, the capacitor top metal layer 802 may be formed by way of a vapor deposition process (e.g., physical vapor deposition, chemical vapor deposition, etc.).

Figure 9:
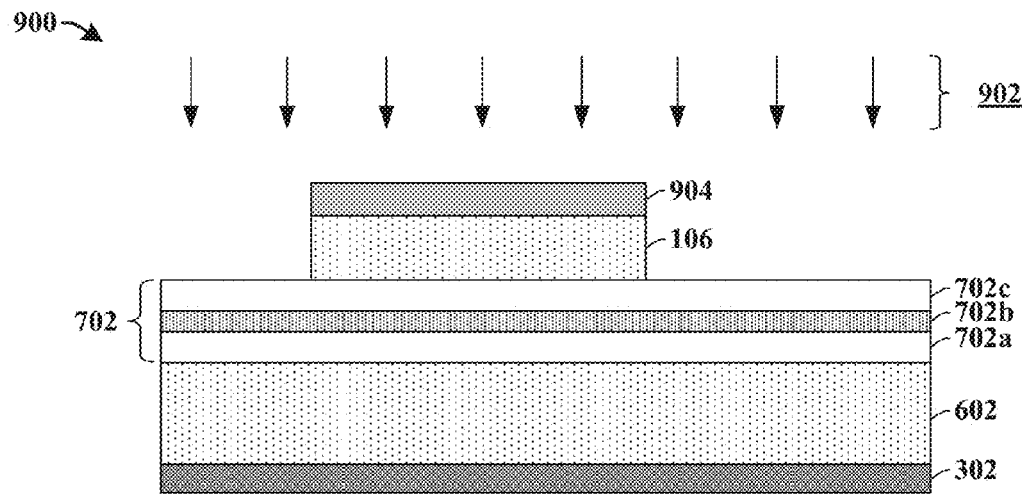

FIG. 9 illustrates some embodiments of a cross-sectional view 900 corresponding to act 514.

As shown in cross-sectional view 900, a masking layer 904 is formed over a part of the capacitor top metal layer 106 to define a top electrode of the MIM capacitor. In some embodiments, the masking layer 904 may comprise a hard mask material. For example, the masking layer 904 may comprise a protective silicon oxy-nitride (PE-SiON) layer deposited by a plasma enhanced chemical vapor deposition technique.

A top electrode etching process is subsequently performed by selectively exposing the capacitor top metal layer 106 to an etchant 902 in areas not covered by the masking layer 904. The etchant 902 removes unmasked areas of the capacitor top metal layer 106 to form a capacitor top electrode comprising the capacitor top metal layer 106. In some embodiments, the etchant 902 may comprise a dry etchant (e.g., a plasma etchant, an RIE etchant, etc.).

Figure 10:
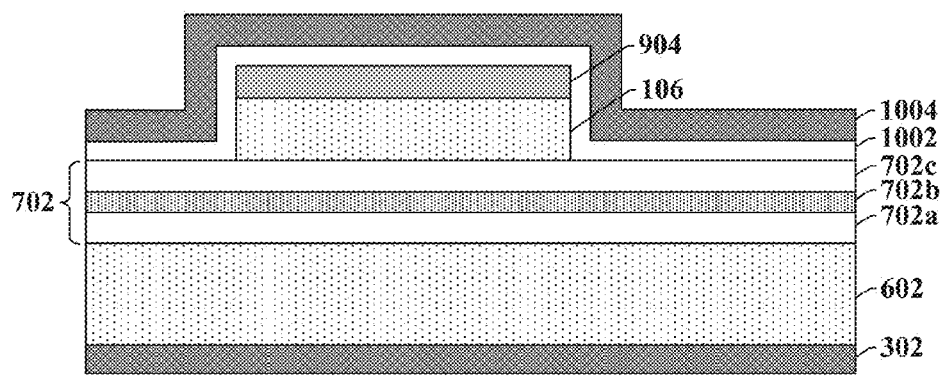

FIG. 10 illustrates some embodiments of a cross-sectional view 1000 corresponding to acts 516-518.

As shown in cross-sectional view 1000, a capping layer 1002 is deposited onto the masking layer 904 and the multi-layer capacitor dielectric layer 702. In some embodiments, the capping layer 1002 may comprise an oxide, for example. A second etch stop layer 1004 is then deposited onto the capping layer 1002. In some embodiments, the second etch stop layer 1004 may comprise silicon nitride (SiN), for example. In some embodiments, the capping layer 1002 and the second etch stop layer 1004 may be deposited by way of a vapor deposition process (e.g., physical vapor deposition, chemical vapor deposition, etc.)

Figure 11:
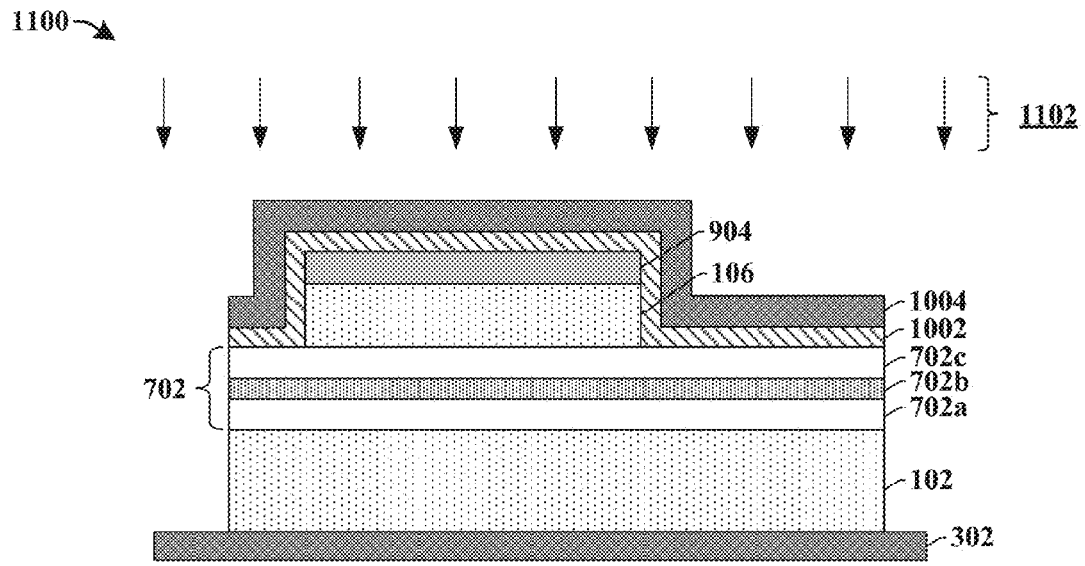

FIG. 11 illustrates some embodiments of a cross-sectional view 1100 corresponding to act 520.

As shown in cross-sectional view 1100, a bottom electrode etching process is performed by selectively exposing the capacitor bottom metal layer 102 to an etchant 1102. The etchant 1102 removes portions of the capacitor bottom metal layer 102 to form a capacitor bottom electrode comprising the capacitor bottom metal layer 102. In some embodiments, the etchant 1102 may comprise a dry etchant (e.g., a plasma etchant, an RIE etchant, etc.).

Figure 12:
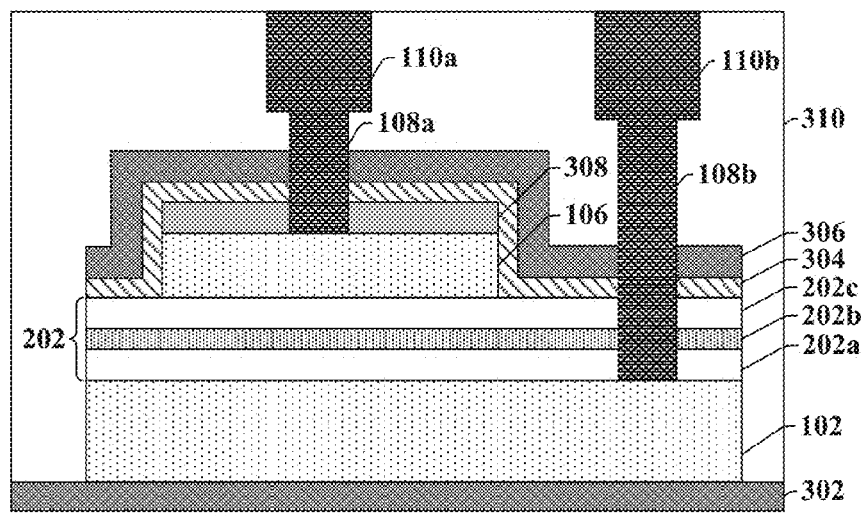

FIG. 12 illustrates some embodiments of a cross-sectional view 1200 corresponding to act 522.

As shown in cross-sectional view 1200, a first metal via 108a and a second metal via 108b are formed to electrically connect first and second metal wires, 110a and 110b, to the capacitor top metal layer 106 and the capacitor bottom metal layer 102, respectively. The first and second vias, 108a and 108b, and the first and second metal wires, 110a and 110b, may be formed by depositing an inter-level dielectric (ILD) layer 310 over the second etch stop layer 306. An etching process (e.g., a dry etching process) is performed to form openings that extend from a top of the ILD layer 310 to the capacitor top metal layer 106 and the capacitor bottom metal layer 102. A metal (e.g., copper, tungsten, aluminum, etc.) is then deposited within the openings to form the first and second vias, 108a and 108b, and the first and second metal wires, 110a and 110b.

Therefore, the present disclosure relates to a method of forming a MIM (metal-insulator-metal) capacitor having a multi-layer capacitor dielectric layer, comprising an amorphous dielectric layer abutting a crystalline high-k dielectric layer, which provides for low leakage and high capacitance density.

In some embodiments, the present disclosure relates to a MIM (metal-insulator-metal) capacitor. The MIM capacitor comprises a capacitor bottom metal layer. A multi-layer capacitor dielectric layer is disposed over the capacitor bottom metal layer. The multi-layer capacitor dielectric layer comprises an amorphous dielectric layer abutting a high-k dielectric layer. A capacitor top metal layer is disposed over the multi-layer capacitor dielectric layer.

In other embodiments, the present disclosure relates to a MIM (metal-insulator-metal) capacitor. The MIM capacitor comprises a capacitor bottom metal layer. A multi-layer capacitor dielectric layer is disposed over the capacitor bottom metal layer. The multi-layer capacitor dielectric layer comprises a first crystalline high-k dielectric layer, an amorphous dielectric layer disposed onto the first crystalline high-k dielectric layer, and a second crystalline high-k dielectric layer disposed onto the amorphous dielectric layer. The amorphous dielectric layer has a larger energy band gap than the first crystalline high-k dielectric layer. The second crystalline high-k dielectric layer has a larger dielectric constant than the amorphous dielectric layer. A capacitor top metal layer is disposed over the multi-layer capacitor dielectric layer.

In yet other embodiments, the present disclosure relates to a method of forming a MIM (metal-insulator-metal) capacitor. The method comprises forming a capacitor bottom metal layer. The method further comprises forming a multi-layer capacitor dielectric layer over the capacitor bottom metal layer, wherein the multi-layer capacitor dielectric layer comprises a first high-k dielectric layer disposed over the capacitor bottom metal layer and an amorphous dielectric layer disposed onto the first high-k dielectric layer. The method further comprises forming a capacitor top metal layer over the multi-layer capacitor dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MIM (metal-insulator-metal) capacitor, comprising:
   a capacitor bottom metal layer;
   a multi-layer capacitor dielectric layer disposed over the capacitor bottom metal layer, wherein the multi-layer capacitor dielectric layer comprises:
      a first crystalline high-k dielectric layer comprising zirconium oxide and located over the capacitor bottom metal layer;
      an amorphous dielectric layer comprising aluminum oxide and disposed onto the first crystalline high-k dielectric layer; and
      a second crystalline high-k dielectric layer comprising zirconium oxide and disposed onto the amorphous dielectric layer, wherein the second crystalline high-k dielectric layer has a larger dielectric constant than the amorphous dielectric layer;
   a capacitor top metal layer disposed over the multi-layer capacitor dielectric layer; and
   wherein the first crystalline high-k dielectric layer and the second crystalline high-k dielectric layer have a first thickness and the amorphous dielectric layer has a second thickness which is larger than the first thickness and that is configured to improve time dependent dielectric breakdown of the MIM capacitor.

2. The MIM capacitor of claim 1,
   wherein the first crystalline high-k dielectric layer and the second crystalline high-k dielectric layer respectively have first and second energy band gaps that are less than approximately 5 eV; and
   wherein the amorphous dielectric layer has a third energy band gap that is greater than or equal to approximately 8 eV.

3. The MIM capacitor of claim 1,
   wherein the first crystalline high-k dielectric layer and the second crystalline high-k dielectric layer respectively have first and second dielectric constants that are greater than approximately 4; and
   wherein the amorphous dielectric layer has a third dielectric constant that is less than approximately 4.

4. The MIM capacitor of claim 1, wherein the amorphous dielectric layer has a larger energy band gap than the first crystalline high-k dielectric layer.

5. A MIM (metal-insulator-metal) capacitor, comprising:
   a capacitor bottom metal layer;
   a multi-layer capacitor dielectric layer disposed over the capacitor bottom metal layer, wherein the multi-layer capacitor dielectric layer comprises:
      a first crystalline high-k dielectric layer comprising yttrium oxide; and
      an amorphous dielectric layer disposed onto the first crystalline high-k dielectric layer, wherein the amorphous dielectric layer has a larger energy band gap than the first crystalline high-k dielectric layer;
      a second crystalline high-k dielectric layer comprising yttrium oxide and disposed onto the amorphous dielectric layer, wherein the second crystalline high-k dielectric layer has a larger dielectric constant than the amorphous dielectric layer; and
   a capacitor top metal layer disposed over the multi-layer capacitor dielectric layer.

6. The MIM capacitor of claim 5, further comprising:
one or more grain boundaries within the first crystalline high-k dielectric layer and the second crystalline high-k dielectric layer, but not extending into the amorphous dielectric layer.

7. The MIM capacitor of claim 1, further comprising:
a masking layer arranged over the capacitor top metal layer;
a capping layer having a stepped structure comprising a first horizontal segment contacting the masking layer and a second horizontal segment contacting the second crystalline high-k dielectric layer, wherein the first horizontal segment is non-planar with the second horizontal segment;
an etch stop layer contacting upper surfaces and sidewalls of the capping layer, wherein the etch stop layer has a bottom surface that overlies a top surface of the multi-layer capacitor dielectric layer; and
an inter-level dielectric layer contacting upper surfaces and sidewalls of the etch stop layer.

8. The MIM capacitor of claim 7, wherein the capping layer comprises an oxide.

9. The MIM capacitor of claim 7, wherein the masking layer comprises PE-SiON.

10. The MIM capacitor of claim 7, further comprising:
a lower etch stop layer separated from the multi-layer capacitor dielectric layer by the capacitor bottom metal layer and contacting a bottom surface of the inter-level dielectric layer.

11. The MIM capacitor of claim 5, further comprising:
a masking layer arranged over the capacitor top metal layer;
a capping layer comprising an oxide and having a first horizontal segment contacting the masking layer and a second horizontal segment contacting the second crystalline high-k dielectric layer;
an etch stop layer contacting upper surfaces and sidewalls of the capping layer; and
an inter-level dielectric layer contacting upper surfaces and sidewalls of the etch stop layer.

12. The MIM capacitor of claim 1, further comprising:
one or more grain boundaries within the first crystalline high-k dielectric layer and the second crystalline high-k dielectric layer, but not extending into the amorphous dielectric layer.

13. The MIM capacitor of claim 5, wherein the first crystalline high-k dielectric layer and the second crystalline high-k dielectric layer have a same thickness.

14. The MIM capacitor of claim 5, wherein the amorphous dielectric layer comprises aluminum oxide ($AlO_2$) or silicon oxide ($SiO_2$).

15. The MIM capacitor of claim 5,
wherein the first crystalline high-k dielectric layer and the second crystalline high-k dielectric layer respectively have first and second energy band gaps that are less than approximately 5 eV; and
wherein the amorphous dielectric layer has a third energy band gap that is greater than or equal to approximately 8 eV.

16. The MIM capacitor of claim 5,
wherein the first crystalline high-k dielectric layer and the second crystalline high-k dielectric layer respectively have first and second dielectric constants that are greater than approximately 4; and
wherein the amorphous dielectric layer has a third dielectric constant that is less than approximately 4.

17. A MIM (metal-insulator-metal) capacitor, comprising:
a first crystalline high-k dielectric layer comprising zirconium oxide and located over a capacitor bottom metal layer;
an amorphous dielectric layer comprising aluminum oxide and contacting the first crystalline high-k dielectric layer, wherein the amorphous dielectric layer has a band gap that is larger than a bandgap of the first crystalline high-k dielectric layer;
a second crystalline high-k dielectric layer comprising zirconium oxide and contacting the amorphous dielectric layer and comprising a same material as the first crystalline high-k dielectric layer, wherein the first crystalline high-k dielectric layer and the second crystalline high-k dielectric layer have a dielectric constant that is larger than a dielectric constant of the amorphous dielectric layer;
a capacitor top metal layer disposed over the second crystalline high-k dielectric layer;
a first contact in electrical contact with the capacitor top metal layer;
a second contact in electrical contact with the capacitor bottom metal layer and vertically extending through the first crystalline high-k dielectric layer, the amorphous dielectric layer, and the second crystalline high-k dielectric layer;
a masking layer arranged over the capacitor top metal layer;
a capping layer having a stepped structure comprising a first horizontal segment connected to a second horizontal segment by a vertical segment, wherein the first horizontal segment is arranged over the masking layer and the second horizontal segment is arranged over the second crystalline high-k dielectric layer;
an etch stop layer contacting upper surfaces and sidewalls of the capping layer; and
an inter-level dielectric layer contacting upper surfaces and sidewalls of the etch stop layer.

18. The MIM capacitor of claim 17, further comprising:
one or more grain boundaries within the first crystalline high-k dielectric layer and the second crystalline high-k dielectric layer, but not extending into the amorphous dielectric layer.

19. The MIM capacitor of claim 17,
wherein the capping layer comprises an oxide; and
wherein the first horizontal segment contacts the masking layer and the second horizontal segment contacts the second crystalline high-k dielectric layer.

20. The MIM capacitor of claim 17, wherein the capacitor top metal layer has sidewalls that are laterally set back from sidewalls of the first crystalline high-k dielectric layer, the amorphous dielectric layer, and the second crystalline high-k dielectric layer.

* * * * *